United States Patent [19]
Henkels et al.

[11] Patent Number: 5,617,047
[45] Date of Patent: Apr. 1, 1997

[54] RESET AND PULSE WIDTH CONTROL CIRCUITS FOR HIGH-PERFORMANCE MULTI-PORT MEMORIES AND REGISTER FILES

[75] Inventors: Walter H. Henkels, Putnam Valley; Wei Hwang, Armonk; Rajiv V. Joshi, Yorktown Heights, all of N.Y.

[73] Assignee: International Business Machines Corporation, Armonk, N.Y.

[21] Appl. No.: 468,173
[22] Filed: Jun. 6, 1995
[51] Int. Cl.$^6$ .................................................. H03K 3/01
[52] U.S. Cl. ...................... 327/142; 327/198; 327/291; 327/295
[58] Field of Search .................................. 327/198, 217, 327/172, 173, 176, 142, 144, 152, 153, 151, 291, 295

[56] References Cited

U.S. PATENT DOCUMENTS

| | | | |
|---|---|---|---|
| 3,979,732 | 9/1976 | Hepworth et al. | 327/153 |
| 4,694,197 | 9/1987 | Sprague | 327/153 |
| 4,940,904 | 7/1990 | Lin | 327/142 |
| 5,124,573 | 6/1992 | Wong | 327/172 |
| 5,252,867 | 10/1993 | Sorrells et al. | 327/153 |
| 5,467,037 | 11/1995 | Kumar et al. | 327/142 |
| 5,498,989 | 3/1996 | Diba | 327/198 |

OTHER PUBLICATIONS

T.I. Chappell et al, "A 2–ns Cycle, 3.8–ns Access 512–kb CMOS ECL SRAM . . .", IEEE J.Solid State Circuits, V26, #11, pp. 1577–1585 Nov. 1991.

*Primary Examiner*—Timothy P. Callahan
*Assistant Examiner*—T. Lam
*Attorney, Agent, or Firm*—Whitham, Curtis, Whitham and McGinn; Robert P. Tassinari, Jr.

[57] ABSTRACT

A single sequential timing chain provides inadequate precision of reset-pulse timing and inadequate reset-pulsewidth control for high-performance memories or register files incorporating dynamic circuits. Also, in such circuits, an inevitable lengthening of pulses, from input to output, ensues. These shortcomings are eliminated by the disclosed multiple-branch circuits, which provide for the generation of appropriate control pulses, and by employment of evaluation-path pulsewidth-shortening circuits appropriately interconnected to the control-generation circuits.

23 Claims, 9 Drawing Sheets

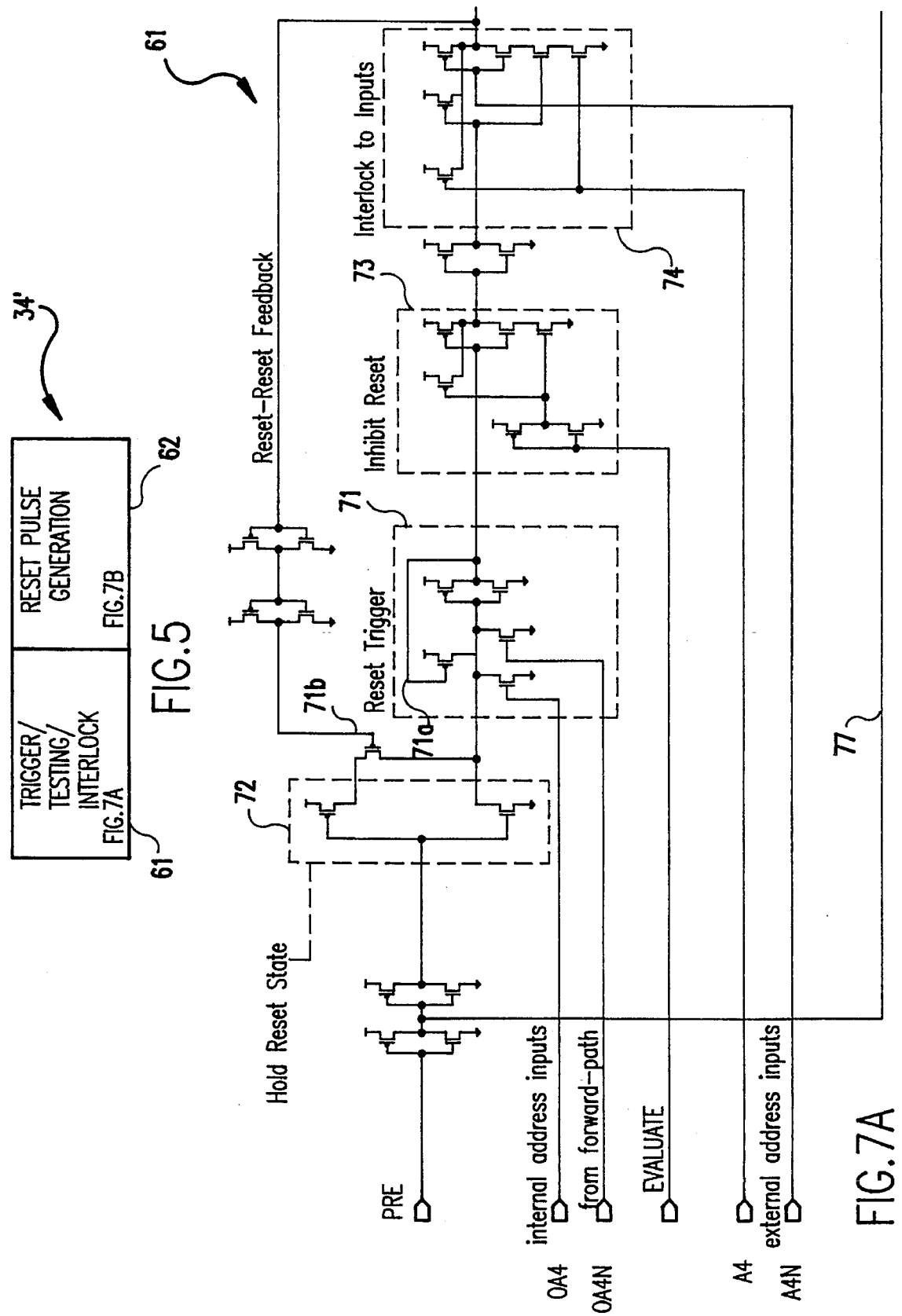

RESET AND PULSE WIDTH CONTROL CIRCUITS FOR HIGH-PERFORMANCE MULTI-PORT MEMORIES AND REGISTER FILES

BACKGROUND OF THE INVENTION

1. Field of the Invention

The present invention generally relates to digital signal processing circuits and, more particularly, to control circuits for digital signal storage devices.

2. Description of the Prior Art

Digital data processors rely on stored digital signals both for control or instruction signals and data signals upon which the control functions or instructions are to be carried out. High performance and so-called processing power thus requires extremely fast access to such stored digital signals. In both processing circuits and memory circuits, the requirement for high speed of operation has led to increasing densities of integration in electronic circuit design and circuits which, once triggered, can carry out relatively complex functions autonomously. Register files and other memory structures are examples of devices which may be designed to perform such autonomous functions.

Timing constraints are of critical concern in high performance data processing and memory circuits as cycle times are reduced for higher speed. Signals require a finite amount of time to propagate through any type of electrical or electronic structure and the proper function of logic circuits requires that the intended signals be present at the inputs thereof in order to obtain the correct output. Signal propagation time is affected by many factors of circuit design such as conductor resistance and parasitic capacitances. At high densities of circuit integration, the number of circuits to which a connection is made may present severe design constraints in regard to cycle time. For example, at high integration densities, a connection such as a word or bit line of a memory will present significant RC delays and waveform distortions where the total switched capacitance, C, is dominated by the sum of device capacitances of a large number of load devices and the total resistance, R, is dominated by the resistance of the long word or bit lines of small cross-section.

To obtain highest operational speed and shortest cycle time in logic circuits employing currently available MOS technology, it is common practice to employ so-called "dynamic" logic circuits in preference to static logic circuits. Generally, in dynamic circuits the goal of maximizing the speed at which a logical function is performed (e.g. "evaluation") is achieved by minimizing the number of switching devices in the evaluation path, and by employing NMOS, rather than the slower-switching PMOS, for the majority of devices in the evaluation path. This optimization of speed of the evaluation path, or "forward path", is achieved at the cost of subsequently having to "reset", or "pro-charge", the dynamic nodes, in preparation for the next logic cycle, to a state from which they may be switched to the other logic state most rapidly, and then only when necessary in accordance with input signals which are evaluated.

Generally, the reset, or pro-charge, operations in current logic chips are ultimately derived from a global clock which is distributed throughout the chip. As chip circuit densities increase, implying larger clock-loading, and as speed requirements increase, implying tighter tolerances on clock skew, it becomes increasingly difficult to effectively distribute a global clock. In response to this difficulty, so-called "self-timed" circuits have been conceived. One such class of circuits, termed "self-resetting" CMOS, "SRCMOS", has been proposed and discussed by T. I. Chappoll et al. in IEEE J. Solid-State Circuits, vol. 26, no. 11, pp. 1577–1585, November 1991.

In SRCMOS circuits the resetting of each logic block (or "macro") is generated internally to the block, independently of the global clock. Thus far, SRCMOS designs have employed simple sequential timing chains implemented with a serial connection of a plurality of inverters and taking outputs from individual inverters in the serial chain to trigger individual reset operations. However, memories, such as register files, pose special unique problems to the design of the reset control circuits in SRCMOS, due to the fact that the densest interior stages are unavoidably significantly slower than the peripheral stages. In such circuits, having significant non-uniformities of stage delays, conventional single sequential reset timing chains do not provide adequate precision of reset timing nor adequate pulsewidth control to allow the highest performance design possible.

To convey a more complete appreciation of the design conflicts which are presented, FIG. 1 shows a circuit 10 which may be considered as operationally representative of a dynamic. In SRCMOS circuit in SRCMOS, logic data are represented as voltage pulses, rather than as the usual voltage levels of static CMOS, and during a logic cycle a dynamic node cycles through three phases: stand-by, evaluation, and reset. Specifically, during the evaluation period, a logical "1" on a circuit node is represented by a voltage pulse of either polarity (a positive pulse if stand-by is ground; a negative pulse if stand-by is Vdd, the supply voltage) and a logical "0" in the absence of a pulse—i.e., the continuation of the stand-by state. As shown in FIG. 1, a dynamic node N has at least 3 devices connected to it: an evaluation (or forward) device 12, a reset device 14, and a stand-by device 16. The dynamic node N is reset by being precharged through transistor 14 in response to a reset pulse R. An input signal representing a logical "1" as a forward path (or evaluation path) pulse having a pulse width PWF (pulse width forward) applied at terminal F, as shown in FIG. 2, will discharge dynamic node N through transistor 12. At some later time, another reset pulse R with a pulse width PWR is applied to again precharge the dynamic node N to the stand-by state which is maintained by the standby transistor 16. The control pulse S for the stand-by device is not shown in FIG. 2, but is approximately the complement of the dynamic node-N waveform.

The switching delays which occur during the charging and discharging of the dynamic node N are indicated by the legends DR and DF, respectively, in FIG. 2. It is considered generally necessary for reliable operation that the pulse widths PWF and PWR be some factor k larger than DF and DR. For example, in some technologies a value of k=5 is currently considered adequate for highly reliable operation. Additionally, to assure that transistors 12 and 14 are not concurrently significantly conductive (referred to as contention), a gap G, which is equal to or greater than zero must also be provided.

Thus it is seen that the minimum cycle time of the circuit of FIG. 2 is CT=(PWF+PWR+G) which must be $\geq$k(DF+ DR). Therefore, for a given cycle time for a dynamic node, if DF is small, DR can be large and if DF is large, DR must be small. The pulse width of the waveform at the dynamic node, which is the forward control pulse for the subsequent logic stage, is $$(PWF-DF)+G+DR \geq PWF+(DR-DF).$$

It can therefore be appreciated that the pulse width on the dynamic node N tracks the pulse width of the forward control pulse PWF.

Since functional logic is only performed during the evaluation period (forward-path) it is desirable to design the forward-path as fast as possible and let the reset be slower, thereby investing most of the chip area and power in devices along the forward-path, and minimizing the area and power required for the reset circuits. Consequently, for a given node, DR is normally greater than DF and so, according to the above formula for the node-N pulsewidth, (DR–DF) is positive and there is a natural expansion of the forward pulsewidth along the forward-path.

To further visualize the design conflicts arising in high performance SRCMOS circuits having the characteristics summarized above, FIG. 3 is a high-level representation of a logic macro 30 fabricated in SRCMOS technology. A logic macro should be understood to comprehend any circuit having a plurality of sequential logic stages requiring a sequential series of pulses to be input thereto for proper operation or reset. The forward evaluation path comprises a mix of static circuits and n sets of resettable dynamic nodes which are reset by a block of reset pulse generation circuits 34 which generate a sequence of reset signals RS1, RS2, . . . RSn, collectively indicated by reference numeral 36. For conventional logic functions a simple timing chain, described above, and triggered by some signal 38 which occurs at an appropriate and reliably repeatable time in the forward path, is generally adequate.

However, a simple serial timing chain is substantially inflexible in that the delays provided are adjustable only in increments of the propagation delay of elements in the timing chain, such as inverters, and that the pulsewidths of the reset pulses, 36, are highly correlated. For example, if 34 is comprised of a serial chain of "balanced" inverters (equal strength PMOS and NMOS devices) the reset-pulse pulsewidths would all be equal. Nevertheless, a simple reset timing chain is generally sufficient for control of reset of logic paths in which the DF's (forward path delays) are sufficiently uniform since uniformity of DF's implies substantial uniformity of the required PWF's, PWR's and DR's for a given cycle time.

However, as pointed out above, maximization of integration density of interior device circuits in memories and register files implies that interior forward delays (DF's) will differ significantly from peripheral circuit delays. This substantial non-uniformity of DF's implies a corresponding non-uniformity in the required forward pulsewidths, PWF's. Furthermore, as mentioned previously, it is desirable to minimize the area and power overhead for the reset circuits. Hence it is desirable to make the DR's (and hence the PWR's) as large as is consistent with the logic cycle time. Thus a non-uniformity of required PWF's leads to a non-uniformity in the preferred PWR's to meet a given cycle time.

However, due to the inflexible nature of simple serial timing chains mentioned above, it is very difficult, in practice, to design a single sequential timing chain that provides for the optimum variability of the PWF's and PWR's. For example, due to the tight correlation of pulsewidths of the pulses 36 in FIG. 3, it is difficult, by means of varying the inverter balancing alone, for adjacent reset pulses, e.g. RS3 and RS4 in FIG. 3, to have very different pulsewidths. Furthermore, every change made in the timing of one reset pulse affects every other reset pulse e.g., changing RS3 affects RS4, RS5, . . . etc. to RSn.

As another example, consider a case where a very slow forward stage follows a fast stage having forward pulsewidth PWF. In that case it is desired that the subsequent forward pulse (e.g. the node-N pulsewidth in FIGS. 1 and 2) have a much larger pulsewidth than PWF. This can be achieved only by either 1.) increasing DR (in FIGS. 1 and 2), or by 2.) increasing the gap, G. If one increases DR and the corresponding PWR, then, due to the pulsewidth correlation mentioned above, the next reset pulse, which controls the reset of the slow stage will also be increased in width, thereby further increasing the cycle time of the slow stage. On the other hand, if the forward pulsewidth is increased by increasing G, the increase in G can be done only in units of 2-inverter delays, which may or may not be acceptable.

Another problem arises for fast stages which follow the slowest stage. Due to the stage-to-stage expansion of PWF's described earlier, all fast stages following the slowest stage will have PWF's larger than necessary (larger than the k×DF criterion) and therefore require smaller PWR's and DR's than would otherwise be provided. This latter fact implies a larger than necessary overhead in associated reset circuit area and power.

Following this progression, the last-stage, or output-stage, will exhibit the widest forward pulsewidth, which can be substantially larger than the widest required interior forward pulsewidth. In a logic path consisting of several macros it is obviously deleterious to the overall cycle time if every macro expands the forward pulsewidths.

In summary, when PWF+PWR for the slowest stage is close to the maximum allowed circuit cycle time, it is difficult, if not impossible, to achieve the required pulse widths and reset timing for an optimal design with a conventional timing reset chain structure. The delay quantization inherent in a timing chain prevents tight adjustments to the leading edges of reset pulses. Also, the natural correlation of PWR's is contrary to the need for variable PWR's in an optimal design (e.g. after the slowest interior stage). Furthermore, allowing propagation of increasing PWF's after the slowest stage causes the output pulses to be wide, the widest in the macro, and requires faster and hence larger than optimal reset circuit elements for all stages following the slowest. All of these problems are exacerbated by RC delays and distortions in extended word and reset lines.

SUMMARY OF THE INVENTION

It is therefore an object of the present invention to provide an arrangement of reset pulse generation circuits which closely matches the requirements of a logic path in which substantial variability in forward delays and forward pulse widths exist.

It is another object of the invention to provide a reset signal generation arrangement which will allow reduction of cycle time without compromising integration density in memory devices and register files.

It is a further object of the invention to provide interaction between the reset generation circuits and forward-path circuits that insures that the output pulses are not necessarily wider than the external input pulses for a logic macro.

It is yet another object of this invention to insure proper functionality of a logic macro when the input pulsewidths are wider than anticipated, without broadening the output pulses.

In order to accomplish these and other objects of the invention, a circuit for providing a sequential series of pulses is provided including an arrangement for receiving an input pulse, and at least two branches for propagation of the input pulse, each of the at least two branches providing a different propagation time of said input pulse.

In accordance with another aspect of the invention, a logic macro is provided including a forward path, and a circuit for providing a sequential series of pulses including an arrangement for receiving an input pulse, and at least two branches for propagation of said input pulse, each of said at least two branches providing a different propagation time of said input pulse.

BRIEF DESCRIPTION OF THE DRAWINGS

The foregoing and other objects, aspects and advantages will be better understood from the following detailed description of a preferred embodiment of the invention with reference to the drawings, in which:

FIG. 5 illustrates a preferred articulation of the reset signal generation circuit, FIG. 6a and 6b respectively show a preferred form of pulse chopping circuit and waveforms applied to and produced by the circuit, FIG. 7a is a detailed schematic depiction of the trigger, testing and interlock section of the reset signal generation circuit.

DETAILED DESCRIPTION OF A PREFERRED EMBODIMENT OF THE INVENTION

Figure 3:
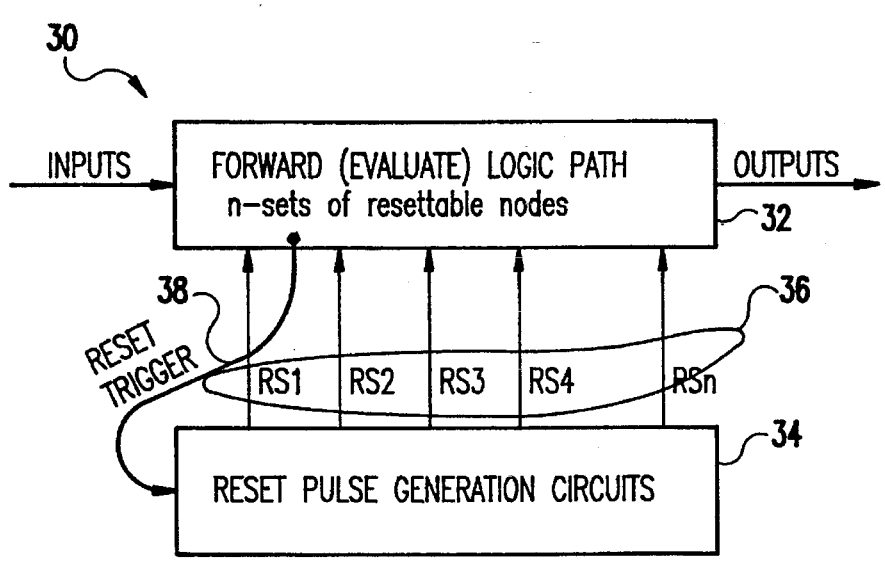
FIG. 3 is a high level diagram of an exemplary logic macro useful in understanding the problems addressed by the invention.
Figure 4:
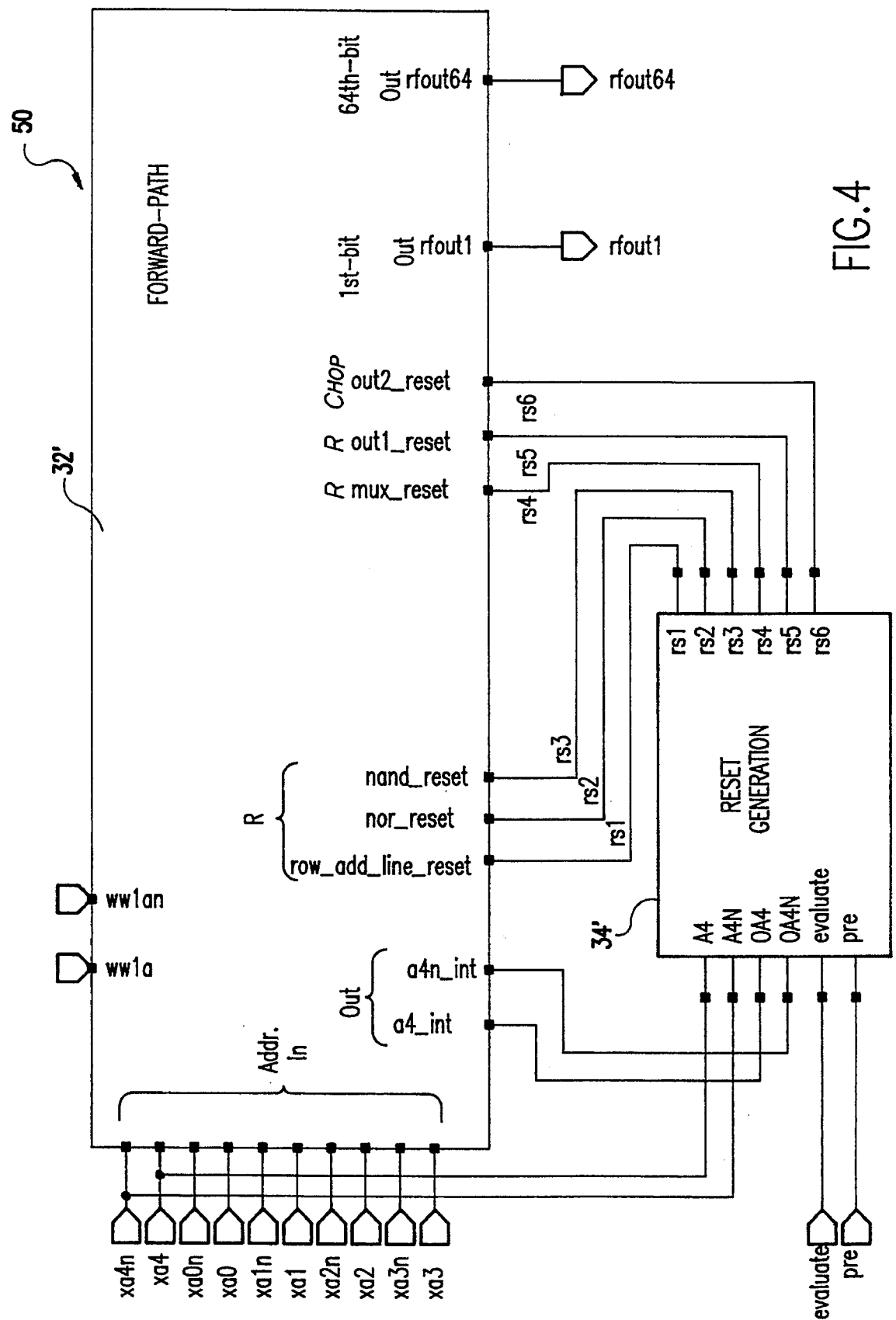
FIGS. 4 and 4a are high level diagrams of differing detail showing a preferred form of a logic macro implementing the invention.
Figure 4A:
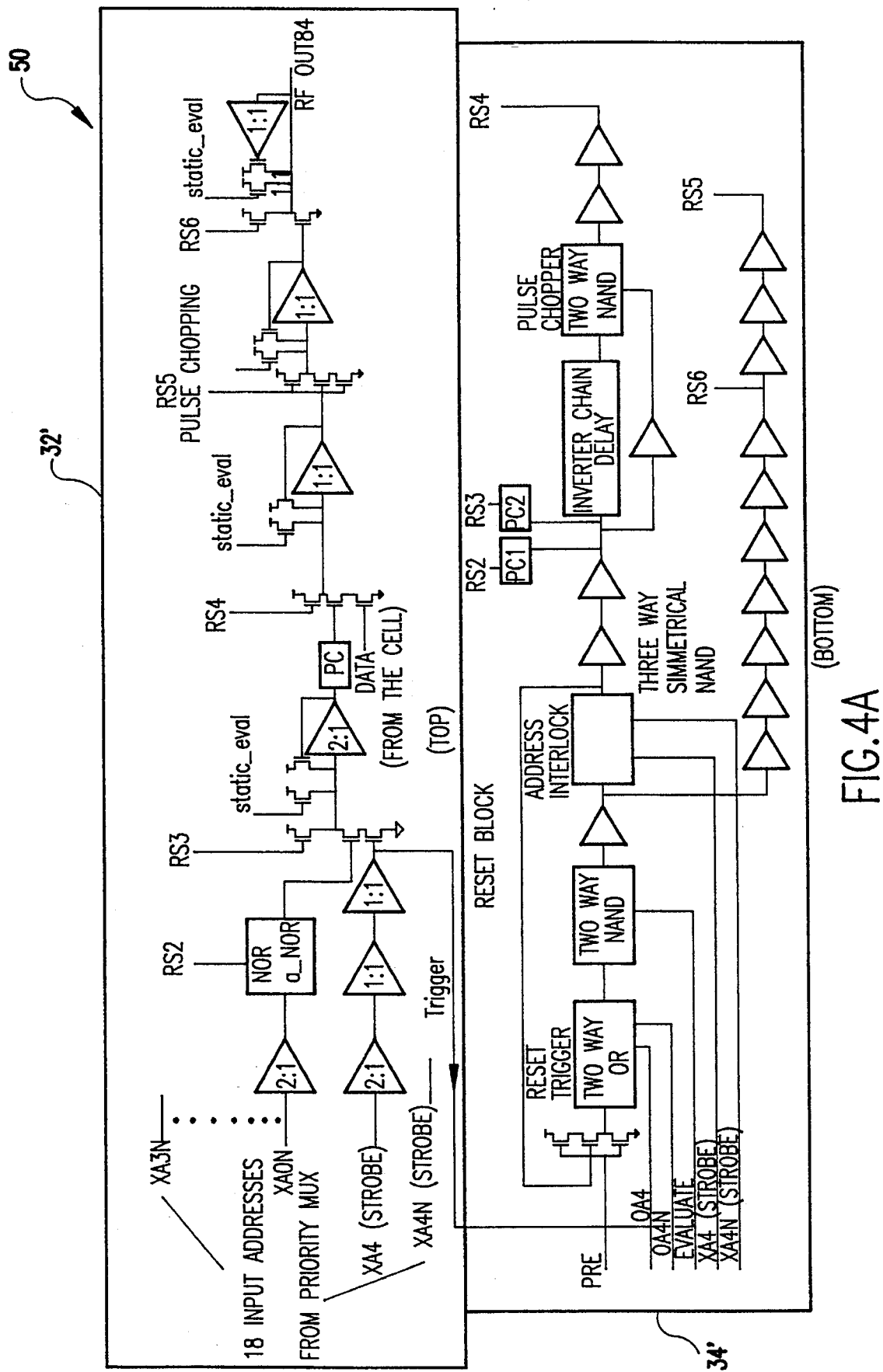

Referring now to the drawings, and more particularly to FIGS. 4 and 4a, there is shown a high-level diagram of a preferred form of a high level logic macro 50, in accordance with the invention, for a single read port of a register file and, like the generalized high-level diagram of FIG. 3 is divided into a forward path 32' and a reset signal generation circuit 34'. This circuit may be duplicated at will to provide as many read ports as desired. In this embodiment, the reset signal generation circuit 34' is preferably triggered by the internal dual-rail least significant bit (LSB) of the address OA4, OA4N of the forward path. However, this triggering is preferably gated with the same LSB A4, A4N of the external address which is to provide an interlock. This interlock prevents resetting of the internal circuits before the external circuits have been reset. Other inputs preferably provided to the forward path or alternatives and possible additions thereto are not particularly important to the practice of the invention and will be understood by those skilled in the art.

The dynamic outputs of the reset signal generation block rs1–rs6 reset the respective dynamic node sets of the forward path. Specifically, rs1 resets the internal address lines (not shown in FIG. 4a), rs2 and rs3 reset the NOR/NAND decoder and thereby cause the word lines to be reset, rs4 resets muxlines and rs5 resets the output lines. As is well-understood in the art, reset of these sets of circuits is preferably done in sequence through the circuit in the same order which an evaluation signal would follow in order to minimize cycle time while providing for the output remaining available until as late a time as possible, often beyond the termination of the cycle which produces that output.

It is an important feature of the invention that the remaining reset circuit output rs6 is used to chop or shorten the forward path pulses after the slowest internal stage. As indicated above, the increase in pulse width of the pulses propagated through the forward path is large in the densely integrated muxline section and it is a principal meritorious effect of the present invention to provide for shortening these pulses before they are allowed to propagate out of the register file. It is to be understood that this principle of the invention can be applied to any dynamic logic circuit wherever propagation of a pulse distorted in width may be undesirable.

It is also considered preferable to provide for "evaluate" and "pre" inputs to be applied directly to reset signal generation circuit 34' for simplifying testing and debugging methodologies. The "evaluate" input, when active, inhibits resetting and the "pre" input, when active, inhibits resetting of the reset circuits, thereby effectively holding the reset state. Also, the "pre" input is used to provide for the initial precharge of all dynamic nodes preliminary to turning on the dynamic inputs of the chip.

To provide these functions, the reset generation circuit 34' may be considered as being divided into two sections as shown in FIG. 5. Specifically, a front-end section 61 provides for triggering, testing and interlock functions and a following section 62, controlled thereby, functions to generate the above-described sequence of reset signals, which are input to the forward path circuits.

Figure 1:
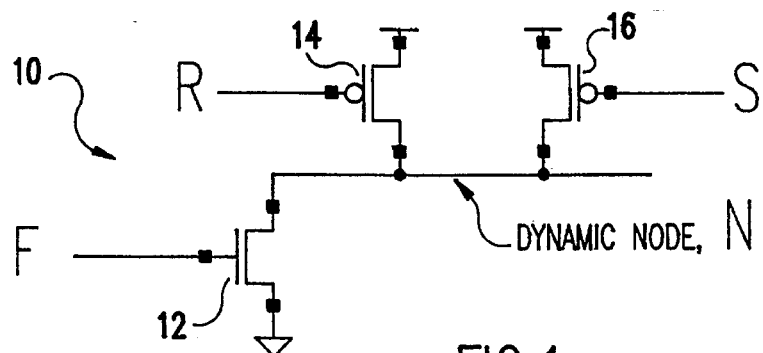
FIG. 1 is a schematic diagram of a simple SRCMOS dynamic logic circuit.
Figure 2:
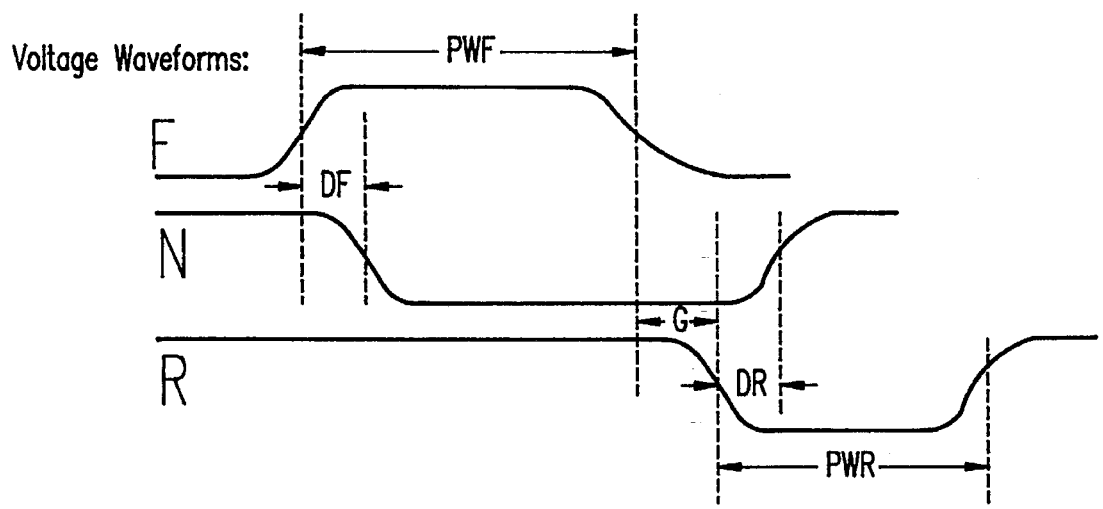
FIG. 2 illustrates the propagation of signals through the circuit of FIG. 1.
Figure 6A:
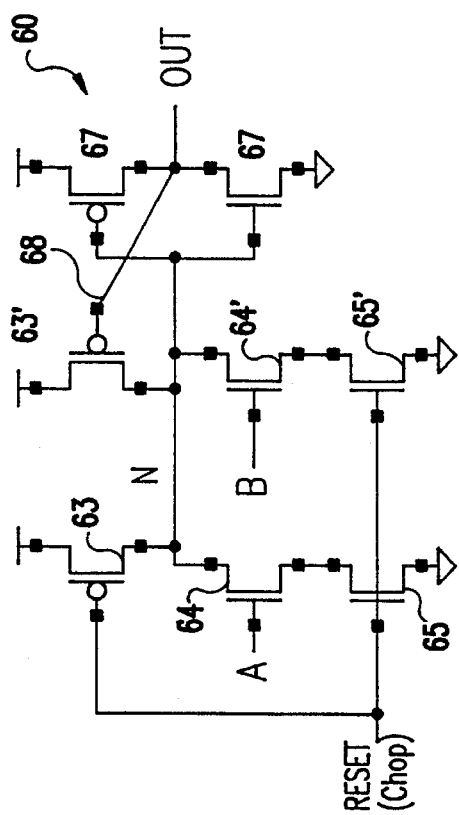

Before discussing the preferred constitution of the sections 61, 62 in detail, a preferred and generic form of a dynamic pulse chopper circuit will be described. As shown in FIG. 6a, pulse chopper circuit 60 is somewhat similar to the exemplary circuit of FIG. 1 in that a dynamic node N can be charged through transistor 63 and discharged through transistor 64 and transistor 63' is a stand-by transistor which holds node N in the precharged state during stand-by. However, transistor 65, which is conductive during stand-by and evaluation, is preferably provided to simultaneously switch into the non-conductive state thereby breaking the conductive path to ground when the reset device 63 is activated. This mechanism prevents voltage division and increased current draw (contention) due to simultaneous conduction through 63 and 64 when the reset occurs before the forward pulse controlling 64 (node A in FIG. 6a) is terminated. Thus this mechanism allows node-N to be safely reset before the forward-pulse input has disappeared. As many inputs as desired may be provided by multiplication of transistors 64 and 65, as indicated by transistors 64' and 65' and the circuit will respond as an OR gate, when the inverter transistors 67 are included. The purpose of the feedback connection 68 attached to the output of the inverter is to control the state of the stand-by transistor 63'. To those skilled in the art, the transistors 67 and 63' together with the feedback 68 comprise what is known as a "half-latch".

Figure 6B:
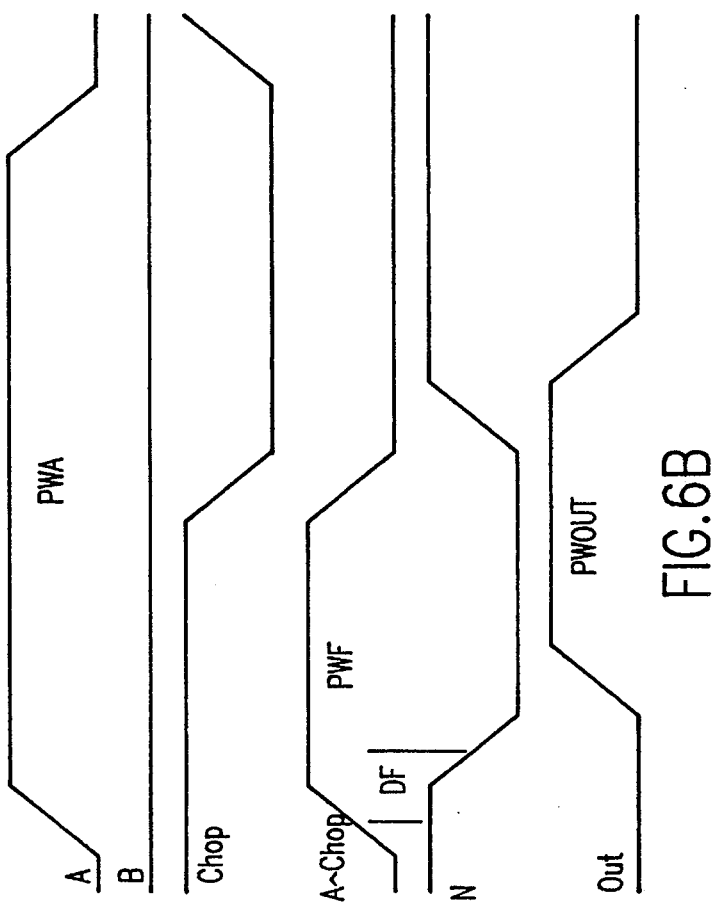

As shown in FIG. 6b, at standby, inputs A and B are low and the chop line is high and transistors 65 (and 65') are conducting. If A (or B) goes high with a pulse of extended pulse width PWA, dynamic node N is discharged after a delay DF. The falling edge of the chop line interrupts the discharge path and resets node N through transistor 63. The timing of the falling edge of the chop pulse is chosen such that the effective forward pulse width is PWF=k×DF (depicted as the A chop waveform) and is produced by the logical ANDing of the A and chop signals due to the serial connection of transistors 64 and 65. Thus PWF is independent of PWA and can be significantly smaller than PWA. The chopped pulse propagates through the inverter stage with further characteristic delay at that stage. As can be seen, the "out" waveform (the PWOUT pulse, which also has the approximate desired effective PWF=(k×DF)) terminates prior to the trailing edge of A even though the leading edge is delayed. It is to be understood that this circuit or its equivalent may be employed at any portion of any serially connected digital circuit when the forward pulse width becomes unacceptably large.

Referring now to FIG. 7a, the trigger, testing and interlock block 61 will be discussed. It is to be understood that the particular interlock and control functions provided are not critical to the practice of the invention but are provided in the interest of completeness and as being exemplary of ways in which any desired interlocks of control functions can be implemented.

In this implementation, resetting is triggered by the dynamic ORing of the internal LSB address true and complement signals OA4 and OA4N in reset trigger circuit 71 which preferably has a half latch output stage providing a feedback signal over connection 71a to hold the stand-by state and enhance switching speed. This signal then passes to a reset inhibit circuit 73 where it can be blocked in response to an active "evaluate" signal by being ANDed with a complement of the "evaluate" signal. If not inhibited by the inhibit reset circuit 73, the reset signal then is passed to an interlock circuit 74, preferably in the form of a three-input NAND gate, which will only pass the reset signal if external inputs are both in the stand-by high logic level; the purpose being to prevent reset until the external address lines have been reset. The output of circuit 74 is then passed to the circuit of FIG. 7b as well as being returned over a feedback path as a "reset-reset" signal to reset device 71b. This feedback signal can be inhibited by an active "pre" signal so that the reset state can be maintained for testing purposes. Otherwise, the reset trigger 71 is reset to the standby state to await another sequence of operations. The complement of the "pre" signal is sent via interconnection 77 to the reset-pulse generation circuits, FIG. 7b, in order to provide the appropriate gating input for any hold-reset-state blocks in those circuits.

Figure 7B:
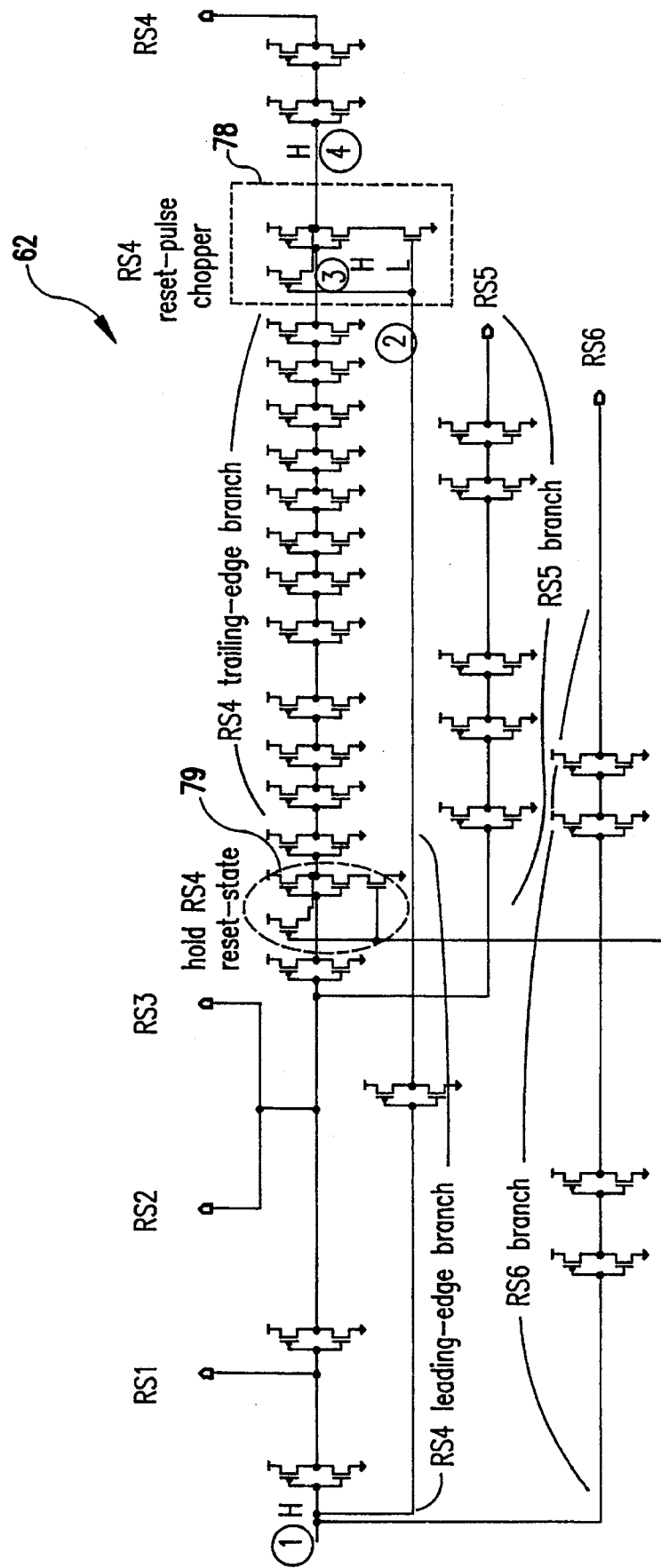
FIG. 7b shows a preferred arrangement for generating a sequence of reset signals.

Referring now to FIG. 7b, the development of an exemplary sequence of reset signals will now be described. It is important to understand that, in accordance with the invention, one technique of assisting the design of the reset circuits is to break up the slow stages in the forward path into multiple faster stages in order to make the forward delays DF more uniform. However, there are significant penalties in terms of wafer or chip area consumed by such a technique and also of total access speed, due to the additional delays of the added stages. Because of these forward path access speed and chip area penalties, it is usually impractical to eliminate all of the non-uniformities in forward delays (DF's). Nevertheless, when certain critical paths involving long delays and substantial pulse width increases are separated and used in combination with pulse chopping in accordance with the invention, a powerful technique for design of high-performance logic circuits is provided.

Accordingly, as shown in FIG. 7b, instead of a single delay chain, the delay is split into a plurality of branches. This splitting into branches avoids the delay quantization problem since each branch delay may be individually adjusted. In the implementation of FIG. 7b, reset signals RS1, RS2 and RS3 are not required to be widely separated in time and may be taken from the same branch. This branch also feeds signals to the input of the RS4 trailing edge branch and the RS5 branch. The RS6 branch, as noted above, is used to chop the pulse width after the muxlines in the forward path; a separate branch is used, containing an appropriate number of delay stages to accommodate the (k×DF) criterion discussed above, without being influenced by the loading of RS1–RS3.

In order to provide that RS4 can have a smaller pulse width than RS3, the RS4 branch is split into two branches to control both the leading and trailing edges of the RS4 pulse. The outputs of these branches are NANDed at the RS4 chopper circuit 78. For an understanding of the operation of this circuit, the H and L designations at various nodes of FIG. 7b, indicated by circled numerals, refer to the stand-by state of the circuit. When the reset signal generation circuitry 62 is triggered, node 1 goes low and signals propagate along both the leading and trailing edge RS4 branches, node 2 goes high and node 4 goes low and subsequently the output of RS4 goes low. After a parallel signal propagates through the trailing edge branch, node 3 goes low and node 4 returns high to chop the RS4 pulse (forcing the RS4 output back to its high stand-by state). Subsequently, when node 1 returns high during reset, no further change occurs at node 4.

Because RS4 has separate branches for its leading and trailing edges, it requires its own hold-reset-state circuit, circuit 79 and line 77, used for test and debug purposes. The function of circuit 79 is similar to the hold-reset-state circuit 72 of FIG. 7a.

In view of the foregoing, it is seen that the principles of the invention may be employed in various ways to provide enhancement of operating speed and reliability of a wide variety of circuits which require a sequence of signals for proper operation. While the above exemplary implementation of a logic macro will enable those skilled in the art to practice the invention in a wide variety of circuits, it is to be understood that the application of the invention can be further generalized.

Figure 8:
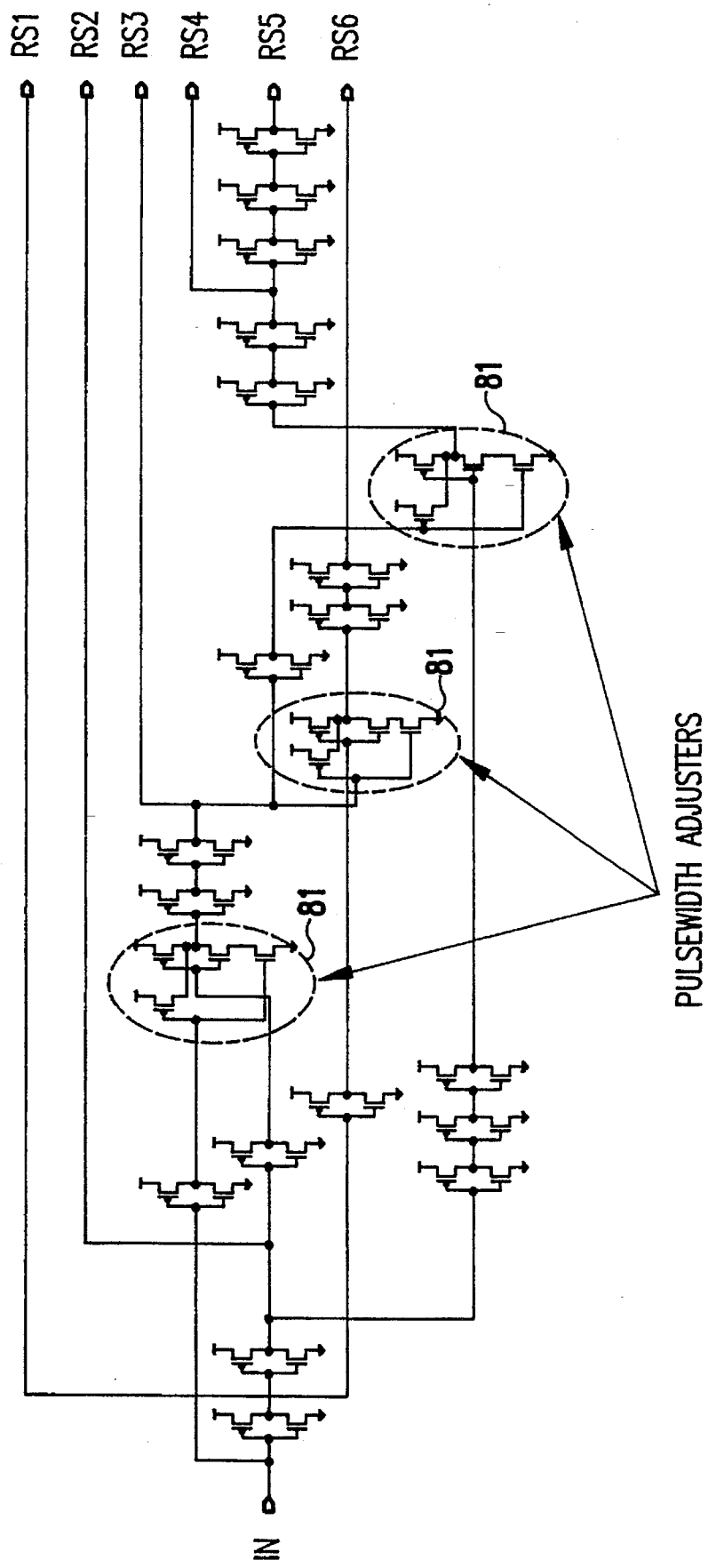
FIG. 8 shows an alternative arrangement for generating a sequence of reset signals in accordance with the invention.

For example, FIG. 8 shows an implementation of a reset signal generation section which may be substituted for the circuit of FIG. 7b. In this implementation, there is no chopping of the slow muxline forward pulses and, equivalently, no addition of interior stages to make the DF's more uniform. Instead, reset pulse width adjusters 81 are employed to directly chop the trailing edges of reset pulses where desired. Specifically, in this embodiment (FIG. 8) there are 4 individually controllable reset pulsewidths: one width for RS1 and RS2, one for RS3, one for RS4 and RS5, and one for RS6.

Figure 9:
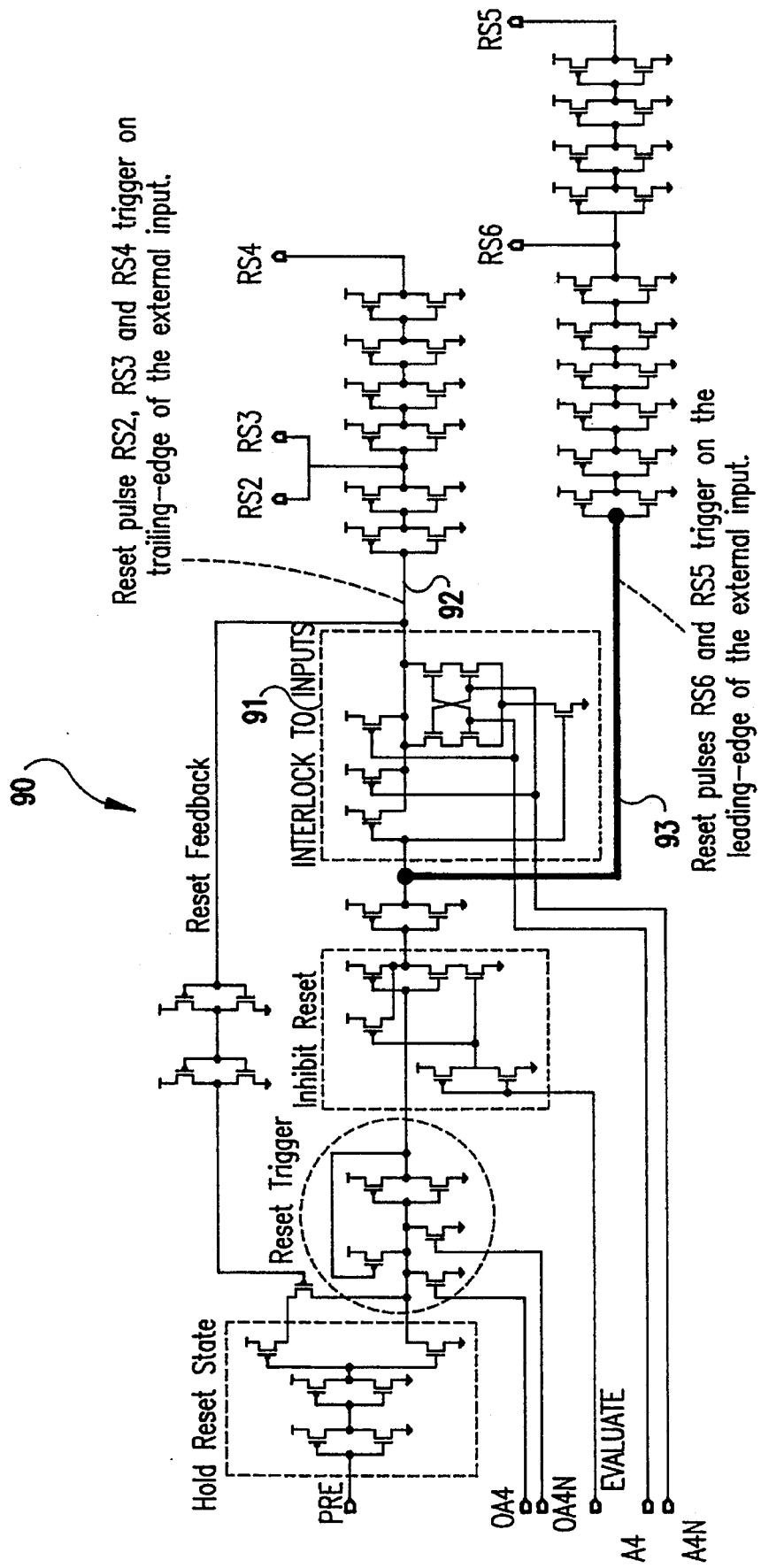
FIG. 9 shows another preferred arrangement of the reset signal generation circuit, in which signals that reset the forward output circuits are synchronized to the leading edge of the external input, rather than to the trailing edge.

FIG. 9 shows a further alternate embodiment of FIGS. 7a and 7b, which when combined with the forward-pulse chopper circuit of FIG. 6a, ensures that the output pulse width of the macro is independent of the pulse width of the external inputs to the macro. Recall that the function of the 3-way NAND interlock block in FIG. 7a was to prevent resetting of internal circuits until the external inputs had reset, in this way ensuring that forward (F) and reset (R) transistors in the input stages would not be simultaneously conducting (in contention); this is necessary to avoid improper functionality and wasted power. For sufficiently wide external input pulses A4 or A4N the reset trigger signal will have propagated from the reset trigger 71 to the interlock 74 before the A4 or A4N pulses have reset, and in that case the input signal at node 1 in FIG. 7b would be synchronized to the trailing edge of the external A4 or A4N pulse. This implies that in FIG. 7b all of the reset pulses, RS1 through RS6, are synchronized to the trailing edge of A4 or A4N and so a wider external input would imply later reset pulses, and in the case of RS6, a later chop pulse, thereby implying a wider output pulse. To reiterate, with the arrangement of FIG. 7a and 7b, and using RS6 to chop the forward pulse at some stage, e.g., at the muxlines, the output pulsewidth is directly correlated to the external input pulsewidth; a wider input implying a wider output.

Figure 10A:
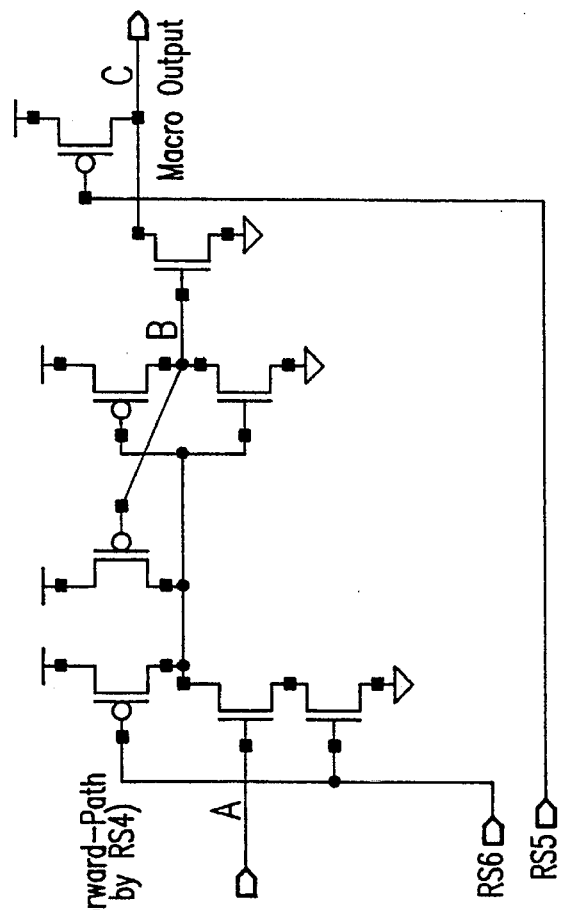
FIG. 10a illustrates the output section of a macro which, when reset via the arrangement of FIG. 9, results in an output pulse whose width is independent of the width of the external input.

The interlock block 91 in FIG. 9 serves the same function as the interlock block 74 in FIG. 7a (except that 91 is symmetrically configured with respect to A4 and A4N). However, for the embodiment of FIG. 9, whereas RS2, RS3 and RS4 are triggered from the output 92 of the interlock and as such are still synchronized to the trailing edge of the external input, for this embodiment RS6 and RS5 are triggered from the node 93 directly preceding the interlock, and hence RS6 and RS5 are synchronized directly to the leading edge of the external inputs. But RS6 and RS5 do not cause any contention if RS6 is subsequently used to reset RS6 is used as a forward pulse-chop signal, as in FIG. 10a, and RS5 is used to reset the macro output (also as in FIG. 10a).

Figure 10B:
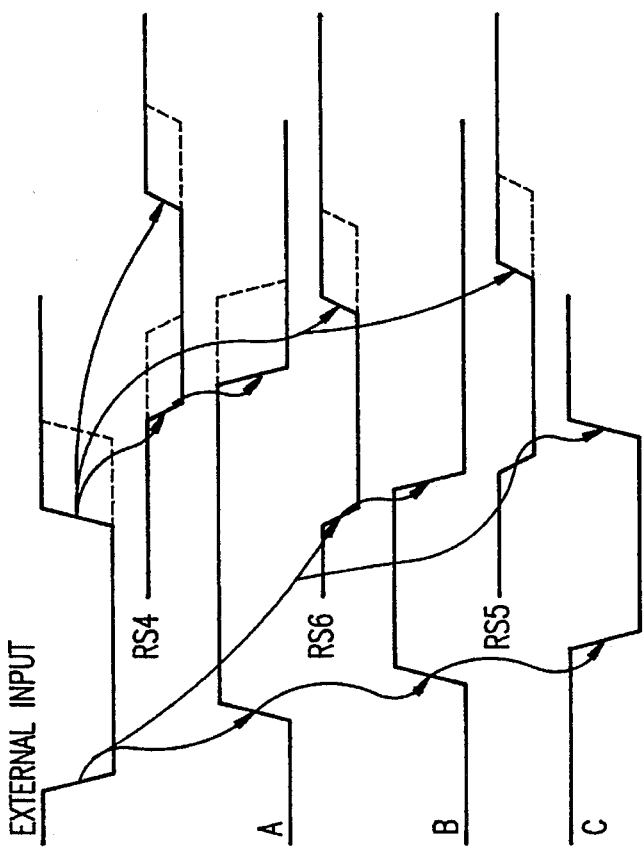
FIG. 10b shows the waveforms corresponding to FIG. 10a and FIG. 9; also showing the correlation of pulse edges to the external input pulse edges.

FIG. 10b summarizes the waveforms A, B and C in the output stages (FIG. 10a) and indicates pulse-edge correlations to the external input. The leading edge of forward-pulse A is synchronized to the leading edge of the external input and the trailing edge of A is synchronized to the trailing edge of the external input, because A is reset by RS4, whose leading (as well as trailing) edge is synchronized to the trailing edge of the input. Hence if the external input is widened, then pulse A will be widened, as shown by the dashed-line extensions. However, since the pulse B is derived from the chopping of pulse A by RS6 and the leading edge of RS6 is synchronized to the leading edge of the external input, both edges of pulse B are synchronized to the leading edge of the input, hence the width of pulse B is independent of the width of the external input pulse. Similarly pulse C is also independent of the external pulsewidth since RS5, which resets pulse C, is also synchronized to the leading edge of the input pulse. Thus the embodiment of FIG. 9 in conjunction with a forward stage such as FIG. 10a effectively decouples the width of the output pulses from the widths of the input pulses.

The embodiment of FIG. 9 shows only two main branches, but in general this could be extended to include more branches if more individual control of the reset pulsewidths is desired.

While the invention has been described in terms of specific preferred embodiments, those skilled in the art will recognize that the invention can be practiced with modification within the spirit and scope of the appended claims.

Having thus described my invention, what we claim as new and desire to secure by Letters Patent is as follows:

1. A logic macro including:
   a forward path comprising
      means for receiving externally-generated pulsed evaluation signals and comprising a plurality of serially-connected dynamic logic circuits, each of said circuits having means for receiving an input pulse and means for generating an output pulse in response thereto, and each of said logic circuits having means for receiving a reset pulse and means for resetting a respective logic circuit to an inactive state in response to said reset pulse, and
      means for generating and outputting a trigger pulse in response to one of said received pulsed evaluation signals; and
   a control circuit for generating a plurality of reset pulses, each of said plurality of reset pulses being input to at least one of said means for receiving a reset pulse in each of said plurality of serially-connected dynamic logic circuits, said plurality of said reset pulses being sequentially timed with respect to one another, said control circuit comprising
   means for receiving said trigger pulse, and at least two branches for propagation of said trigger pulse, each of said at least two branches having a different propagation time than the other and each having means responsive to a propagated trigger pulse for outputting at least one of said plurality of reset pulses.

2. A logic macro as recited in claim 1, wherein said control circuit for generating a plurality of reset pulses includes at least three branches for propagation of said trigger pulse, said control circuit further including a logic circuit having means for receiving said trigger pulse as it propagates through at least two of said at least three branches, and means for changing a pulse width of said trigger pulse as it propagates through at least one of said at least three branches.

3. A logic macro as recited in claim 1, wherein at least one of said logic circuits in said forward path includes means for varying a length of its output pulse in accordance with a received reset pulse.

4. A logic macro as recited in claim 1, wherein
   said control circuit for generating said plurality of reset pulses further includes
   means for receiving an external inhibit signal, and
   means for inhibiting generation of said reset pulses by said control circuit in response to said inhibit signal.

5. A logic macro as recited in claim 1, wherein
   said control circuit for generating said plurality of reset pulses further includes:
   an interlock means comprising: means for detecting an inactive state said externally generated pulsed evaluation signals, and means for preventing generation of said plurality of reset pulses prior to detection of said inactive state.

6. A logic macro as recited in claim 3, wherein
   said control circuit for generating said plurality of reset pulses further includes:
   means for receiving an external inhibit signal, and
   means for inhibiting generation of at least one of said reset pulses by said control circuit in response to said external inhibit signal.

7. A logic macro as recited in claim 3, wherein
   said control circuit for generating said plurality of pulses further includes:

an interlock means including
   means for detecting an inactive state of said externally-generated pulsed evaluation signal, and
   means for preventing generation of said plurality of rest pulses by said control circuit prior to dection of said inactive state.

8. A logic macro as recited in claim 4, wherein said means for inhibiting generation of said reset pulses includes means for preventing propagation of at least one of a leading and trailing edge of said trigger pulse.

9. A logic macro as recited in claim 1, further including means coupled between said means for receiving said trigger pulse and said at least two branches, responsive to another input signal for selectively preventing propagation of said trigger pulse in said at least two branches.

10. A logic macro as recited in claim 1, wherein at least one of said at least two branches includes means for separately controlling the timing of leading and trailing edges of at least one of said reset pulses, said means including:
   a first sub-branch for propagating the leading edge of the trigger pulse;
   a second sub-branch for propagating the trailing edge of the trigger pulse, said first and second sub-branches having respectively different propagation times; and
   a circuit having means for initiating output of said at least one reset pulse in response to the propagated leading edge of the trigger pulse and means for terminating output of said at least one reset pulse in response to the propagated trailing edge of the trigger pulse.

11. A logic macro as recited in claim 1 wherein at least one of said at least two branches is subdivided into at least two further sub-branches for propagation of said trigger pulse.

12. A circuit, comprising:
   a forward path including means for receiving an external forward path signal, means for outputting a first trigger pulse in response to said received external forward path signal, and means for receiving a plurality of reset signals;
   a control circuit coupled to said forward path comprising:
      trigger means having means for receiving said first trigger pulse and means for generating and outputting a second trigger pulse from an output of the trigger means in response to said first trigger pulse;
      An interlock, having detecting means for detecting an inactive state of said external forward path signal, and having means for receiving said second trigger pulse, and having means for producing an interlock signal in response to said second trigger pulse based on said detecting means detecting the external forward path signal in said inactive state;
   means for resetting said output of said trigger means to an inactive state in response to said interlock signal;
   a first pulse generator circuit comprising means for generating at least one reset pulse in response to the interlock signal, and means for transmitting said at least one reset pulse to said means for receiving a plurality of reset signals; and
   a second pulse generator circuit for generating at least one reset pulse in response to said second trigger pulse, regardless of a status of the interlock signal, and means for transmitting said at least one reset pulse to said means for receiving a plurality of reset signals.

13. The circuit of claim 12, further comprising:
   an inhibit reset means coupled between the trigger means and the interlock, including means for receiving an external test signal, for preventing propagation of a leading edge of the second trigger pulse to the interlock in response to said external test signal.

14. The circuit of claim 12, further comprising:
   a hold-reset circuit having mean for receiving a global test signal, test detecting means for detecting a predetermined state of the global test signal, and means for inhibiting generation of a trailing edge of the second trigger pulse when said test detecting means detects that the global test is in the predetermined state.

15. The circuit of claim 12, wherein the second pulse generator circuit includes a plurality of third pulse generator circuits, each of said third pulse generator circuits having means for outputting a plurality of said reset pulses sequentially timed with respect to one another.

16. The circuit of claim 12, wherein the first pulse generator circuit comprises a plurality of fourth pulse generator circuits, each of said fourth pulse generator circuits having means for outputting a plurality of said reset pulses sequentially timed with respect to one another.

17. The circuit of claim 12, wherein at least one of the first and second pulse generator circuits further comprises:
   means for independently setting a timing of the leading and trailing edges, with respect to one another and with respect to said second trigger signal, of at least one of said plurality of reset pulses output, said means comprising:
      a leading edge propagation branch, coupled to the output of trigger means and the output of the interlock;
      a trailing edge propagation branch, couple to the output of the trigger means and the output of the interlock; and
   means for initiation generation of an output pulse in response to a leading edge of a signal propagated through said leading edge propagation branch and terminating generation of said output pulse in response to a trailing edge a signal propagated through said trailing edge propagation branch.

18. The circuit of claim 15, wherein at least one of said third pulse generator circuits includes
   means for independently setting a timing of the leading and trailing edges, with respect to one another and with respect to said second trigger signal, of at least one of said plurality of reset pulses output, said means comprising:
      a lading edge propagation branch, coupled to the output of the rigger means and the output of the interlock;
      a trailing edge propagation branch, coupled to the output of the trigger means and the output of the interlock; and
   means for initiation generation of an output pulse in response to a leading edge of a signal propagated through said leading edge propagation branch an terminating generation of said output pulse in response to a trailing edge of a signal propagated through said trailing edge propagation branch.

19. A dynamic logic circuit, comprising:
   at least one dynamic logic circuit including:
      a dynamic node,
      means for receiving an external reset signal and charging said dynamic node in response to said reset signal having a first state,
   means for receiving a plurality of externally generated forward path input signals,
   means for discharging said dynamic node in response to at least one of said plurality of forward path input signals, said means including a switchable conducting path from the dynamic node to a ground and means for switching the conducting path to said first state in response to said at least one forward path input signal having said first state concurrent with the external reset signal having a second state;

means connected to said dynamic node for generating a logic output in response to a voltage on said node; whereby the external reset signal having said first state resets the dynamic node to a charged state regardless of the state of any of the plurality of forward path input signals input to said switching means, and whereby a logic output pulse having a width narrower than a width of a pulse of any of the forward path input signals input to the switching means is output if said reset signal attains said first state prior to all of said forward path input signals attaining said second state.

20. A circuit according to claim 19, further comprising:

means for receiving at least one of said externally generated forward path input signals and for generating said reset signal in response to said logic output, wherein said dynamic logic node is self-reset to a charged state in response to said logic output.

21. A circuit according to claim 20 wherein said means for receiving said at least one of said externally generated forward path input signals and for generating said reset signal in response to said logic output comprises:

trigger means having means for generating and outputting a trigger pulse in response to said at least one of said externally generated forward path input signals;

an interlock, having detecting means for detecting an inactive state of said at least one of said externally generated forward path input signals, and having means for receiving said trigger pulse, and having means for producing an interlock output signal in response to said trigger pulse based on said detecting means detecting said at least one of said externally generated forward path input signals in said inactive state, means for resetting the trigger pulse to an inactive state in response to said interlock output signal;

a first pulse generator circuit comprising means for generating at least one reset pulse in response to the interlock signal output, and having means for transmitting said at least one reset pulse to said dynamic logic circuit;

a second pulse generator circuit comprising means for generating at least one reset pulse in response to said trigger pulse, regardless of a state of the interlock signal output, and means for transmitting said at least one reset pulse to said dynamic logic circuit.

22. The circuit of claim 21, wherein the first pulse generator circuit comprises a plurality of third pulse generator circuits, each of said third pulse generator circuits having means for outputting a plurality of pulses sequentially timed with respect to one another.

23. The circuit of claim 21, wherein at least one of the first and second pulse generator circuits further comprises:

means for independently setting a timing of the leading and trailing edges, with respect to one another and with respect to said trigger pulse, of at least one of said output plurality of pulses, said means comprising a leading edge propagation branch having means for receiving said trigger pluse and for propagating a leading edge thereof;

a trailing edge propagation branch having means for receiving said trigger pulse and for propagating a trailing edge thereof; and means for initiation generation of an output pulse in response to a leading edge propagated through said leading edge propagation branch and terminating generation of said output pulse in response to a trailing edge propagated through said trailing edge propagation branch.

\* \* \* \* \*